US011833736B2

(12) United States Patent
Koura et al.

(10) Patent No.: US 11,833,736 B2
(45) Date of Patent: Dec. 5, 2023

(54) METHOD OF CONTROLLING IMPRINT APPARATUS, IMPRINT APPARATUS, AND METHOD OF MANUFACTURING ARTICLE

(71) Applicant: CANON KABUSHIKI KAISHA, Tokyo (JP)

(72) Inventors: Yoshihiro Koura, Utsunomiya (JP); Kunihiko Asada, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 209 days.

(21) Appl. No.: 16/808,430

(22) Filed: Mar. 4, 2020

(65) Prior Publication Data
US 2020/0282630 A1 Sep. 10, 2020

(30) Foreign Application Priority Data

Mar. 8, 2019 (JP) ................................. 2019-043044

(51) Int. Cl.
*B29C 59/02* (2006.01)
*G03F 7/00* (2006.01)
*H01L 21/027* (2006.01)

(52) U.S. Cl.
CPC ............ *B29C 59/02* (2013.01); *G03F 7/0002* (2013.01); *H01L 21/027* (2013.01)

(58) Field of Classification Search
CPC ... G03F 7/0002; G03F 7/70625; B29C 59/02; H01L 21/027
See application file for complete search history.

(56) References Cited

U.S. PATENT DOCUMENTS

| 2002/0019729 A1* | 2/2002 | Chang ....................... G03F 1/26 703/6 |
| 2015/0338751 A1* | 11/2015 | Ogura ................. G03F 7/70725 355/72 |
| 2016/0001492 A1* | 1/2016 | Yamaguchi ........... B29C 33/424 425/225 |
| 2017/0363969 A1* | 12/2017 | Hauptmann ........ G03F 7/70508 |

FOREIGN PATENT DOCUMENTS

| JP | 2015035509 A | * | 2/2015 |
| JP | 2015035509 A | | 2/2015 |
| JP | 2017199760 A | * | 11/2017 |

* cited by examiner

*Primary Examiner* — Emmanuel S Luk
*Assistant Examiner* — Victoria Bartlett
(74) *Attorney, Agent, or Firm* — Carter, DeLuca & Farrell LLP

(57) ABSTRACT

A method of controlling an imprint process to form a pattern by using a mold on a substrate is provided. The method includes inspecting to determine whether to continue or stop a series of imprint processes during the series of imprint processes of a lot, wherein the inspecting includes capturing an image of the pattern formed on a shot region by the imprint process, obtaining, by comparing a position of a peripheral portion of the pattern in the image and a design value of the position of the peripheral portion, an extrusion amount of an imprint material from the shot region due to the imprint process, and determining, based on a change in the extrusion amount over a plurality of imprint processes, a next process to transition from a current process upon stopping the series of imprint processes.

12 Claims, 6 Drawing Sheets

METHOD OF CONTROLLING IMPRINT APPARATUS, IMPRINT APPARATUS, AND METHOD OF MANUFACTURING ARTICLE

BACKGROUND OF THE INVENTION

Field of the Invention

The present invention relates to a method of controlling an imprint apparatus, the imprint apparatus, and a method of manufacturing an article.

Description of the Related Art

An imprint technique has gained attention as a new pattern formation technique for manufacturing a semiconductor device. An imprint apparatus forms an imprint material pattern on a substrate by curing an imprint material in a state in which a mold has been brought into contact with the imprint material on the substrate such as a silicon wafer, a glass plate, or the like and separating the cured imprint material from the mold.

In an imprint apparatus, the imprint material may be extruded from the pattern region when the imprint material is brought into contact with the mold, and this may influence the subsequent imprint process. Japanese Patent Laid-Open No. 2015-035509 discloses that a subsequent process is determined after inspecting whether there is an extruding imprint material and whether a foreign object has adhered to the mold.

However, in the technique of the related art, only control to stop the next imprint process is performed in a case in which the extrusion of the imprint material or the adherence of a foreign object to the mold is determined in the inspection process. To improve the maintainability of the imprint apparatus, early detection of the extrusion of the imprint material or the adherence of a foreign object to the mold is needed, and a measure corresponding to the detected status needs to be taken.

SUMMARY OF THE INVENTION

The present invention provides a method of controlling an imprint apparatus which is advantageous in the point of maintainability.

The present invention in its one aspect provides a method of controlling an imprint apparatus that performs an imprint process to form a pattern by an imprint material by using a mold on a shot region of a substrate. The method includes inspecting to determine whether to continue or stop a series of imprint processes during the series of imprint processes of a lot, wherein the inspecting includes capturing an image of the pattern formed on the shot region by the imprint process, obtaining, by comparing a position of a peripheral portion of the pattern in the image obtained in the capturing and a design value of the position of the peripheral portion, an extrusion amount of the imprint material from the shot region due to the imprint process, and determining, based on information indicating a change in the extrusion amount over a plurality of imprint processes, a next process to transition from a current process upon stopping the series of imprint processes.

Further features of the present invention will become apparent from the following description of exemplary embodiments (with reference to the attached drawings).

DESCRIPTION OF THE EMBODIMENTS

Figure 1:
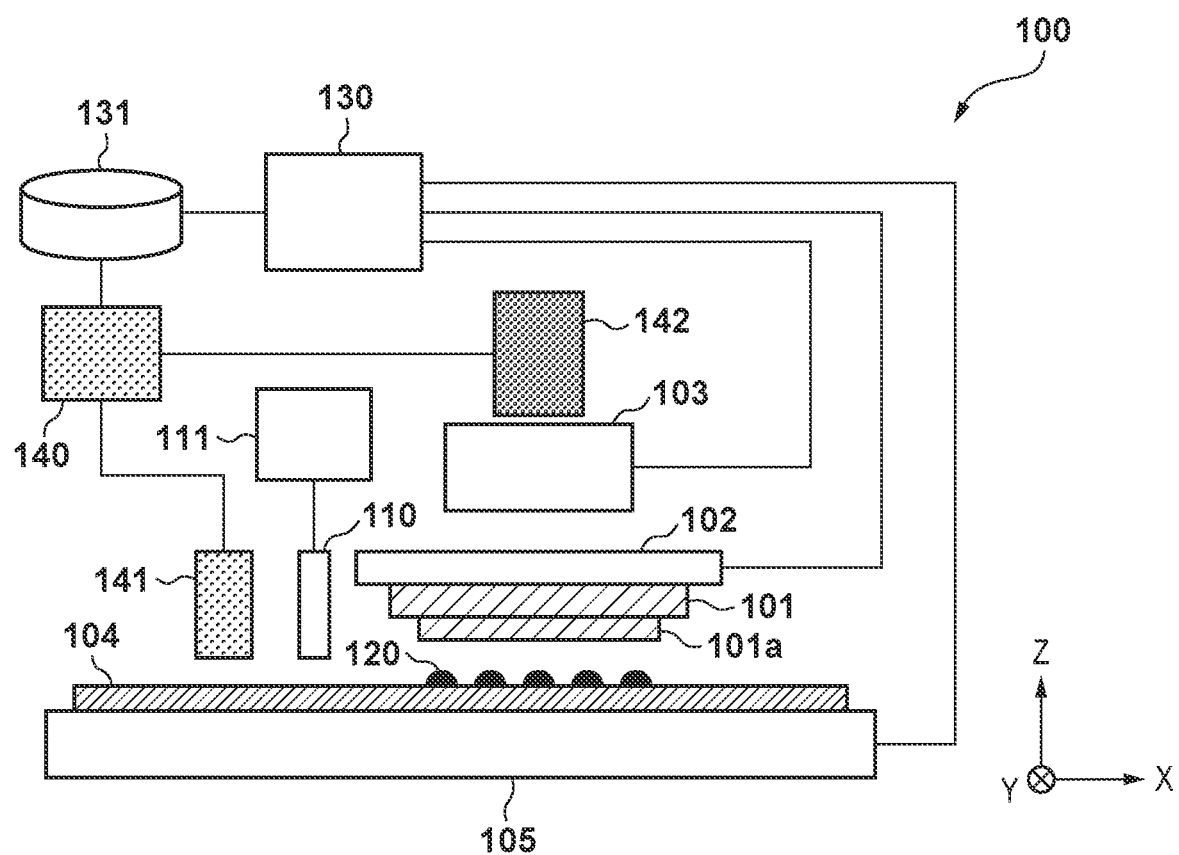
FIG. 1 is a view showing the arrangement of an imprint apparatus according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In this specification and the attached drawings, directions are indicated in an XYZ-coordinate system in which an XY plane is set to be parallel to the surface of a substrate. Directions parallel to the X-axis, the Y-axis, and the Z-axis are referred to as the X direction, the Y direction, and the Z direction, respectively. Reference symbols $\theta x$, $\theta y$, and $\theta z$ denote the rotation about the X-axis, the rotation about the Y-axis, and the rotation about the Z-axis, respectively.

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

FIG. 1 is a view showing the arrangement of an imprint apparatus 100 according to an embodiment. The imprint apparatus 100 is a lithography apparatus used in a manufacturing process of a semiconductor device or the like, and forms an imprint material pattern by using a mold on a shot region (to be also simply referred to as a "shot" hereinafter) of a substrate. In this embodiment, the imprint apparatus 100 adopts, as an imprint material curing method, a photo-curing method of curing an imprint material by irradiating the imprint material with ultraviolet light. However, the present invention is not limited to this, and a heat-curing method of curing the imprint material by applying heat to the imprint material may be adopted.

A mold holding unit 102 holds mold 101, and a stage 105 holds a substrate 104. The mold 101 held by the mold holding unit 102 has, on a surface facing the substrate 104 held by the stage 105, a mesa portion 101a which protrudes more to the side of the substrate 104 than to the peripheral region. The mesa portion 101a includes a pattern portion on which a pattern to be transferred to an imprint material 120 supplied on the substrate 104 is formed. The mold 101 has, for example, a rectangular outer shape and is formed by a material (such as quartz or the like) that can transmit ultraviolet light. The mold holding unit 102 holds (fixes) the mold 101 by a vacuum chuck force or an electrostatic force. The mold holding unit 102 includes a driving mechanism that drives the mold 101 in a Z direction (a direction perpendicular to the surface of the substrate 104), and brings the mold 101 into contact with the uncured imprint material 120 (imprinting), which has been supplied on the substrate 104, by an appropriate force. A curing unit 103 irradiates the imprint material 120 with ultraviolet light via the mold 101 in this state of contact between the mold and the imprint material. As a result, the imprint material 120 is cured. Subsequently, the mold holding unit 102 separates (mold separation) the mold 101 from the cured imprint material 120 on the substrate 104. In addition, the mold holding unit 102 may have a tilt function for correcting the tilt of the mold 101 with respect to the substrate 104.

The substrate 104 is a substrate onto which the pattern of the mold 101 is to be transferred, and includes, for example, a single-crystal silicon wafer, an SOI (silicon on insulator) wafer, or the like. The stage 105 includes a substrate chuck for holding the substrate 104 and a driving mechanism for aligning the mold 101 and the substrate 104. This driving mechanism is formed by, for example, a coarse driving system and a fine driving system, and drives the substrate 104 in an X direction and a Y direction (directions parallel to the surface of the substrate 104). This driving mechanism may also have a function for driving the substrate 104 in the Z direction and a θZ direction and a tilt function for correcting the tilt of the substrate 104.

A dispenser 110, which is an imprint material supplying apparatus, is connected, via a tube, to a tank 111 that stores an imprint material. The dispenser 110 includes, for example, a plurality of nozzles to supply the imprint material to the substrate 104. Also, the unit of quantity of the imprint material to be supplied by the dispenser 110 is "droplet", and a droplet of imprint material has an amount of about several picoliters. The interval between positions at which the imprint material can be dropped is several μm. A layer of the imprint material 120 is formed on the shot region of the substrate 104 by moving (scan movement or step movement) the stage 105 while supplying the imprint material from the dispenser 110.

A controller 130 controls the overall (operation of) imprint apparatus 100. The controller 130 functions as a processor that performs an imprint process by controlling each unit of the imprint apparatus 100. The controller 130 also functions as a process sequence controller of processes including the exchange process of the mold 101 and the substrate 104. The controller 130 can be implemented by a computer apparatus that includes a CPU and a memory. In addition, a storage unit 131 is a storage medium such as a hard disk, a memory, or the like, and may also be a computer apparatus such as a server or a PC that includes such a storage medium. Alternatively, the storage unit 131 may be included in the computer that functions as the controller 130.

An image processing unit 140 controls a first image capturing unit 141 and a second image capturing unit 142 and analyzes images obtained from the image capturing operations performed by the first image capturing unit 141 and the second image capturing unit 142. The first image capturing unit 141 is used to directly observe the upper surface of the substrate, and is used for positioning the substrate and for observing the pattern on the substrate in a high resolution. The second image capturing unit 142 can include a high-resolution camera used for positioning the alignment marks of the mold 101 and the alignment marks of the substrate 104 and a low-resolution camera that can capture the overall pattern formed on the substrate 104 by the mold 101.

Figure 2A:
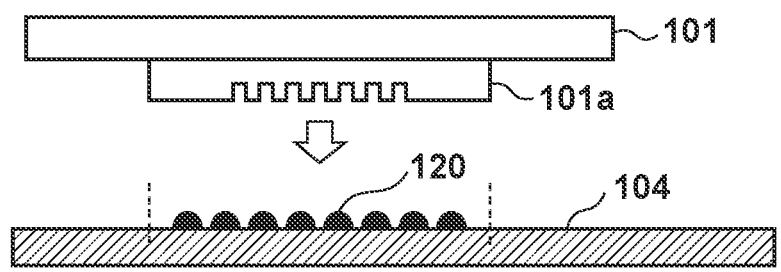
FIGS. 2A to 2C are views for explaining the extrusion of an imprint material that can occur in an imprint process.

The extrusion of the imprint material that can occur in the imprint process will be described next with reference to FIGS. 2A to 2C and FIGS. 3A to 3C. In the imprint apparatus 100, the mold 101 is loaded to the mold holding unit 102 and the substrate 104 is loaded to the stage 105. The stage 105 is driven, and the dispenser 110 supplies the imprint material 120 onto the shot region (the pattern formation region) of the substrate 104. Subsequently, the stage 105 is driven so that the shot region will be positioned below the mold 101 (FIG. 2A).

Figure 2B:
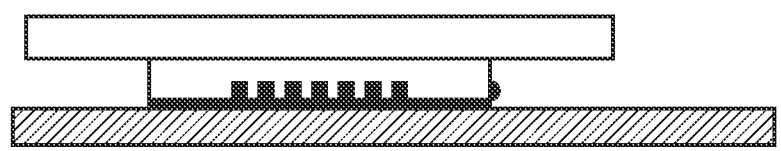

Next, when the mold holding unit 102 is lowered so that the mold 101 and the imprint material 120 on the shot region are brought into contact with each other, the pattern portion of the mold 101 is filled with the imprint material 120. At this time, a portion of the imprint material 120 is extruded from the shot region and adheres to the edge portion of the mesa portion 101a (FIG. 2B).

Figure 2C:
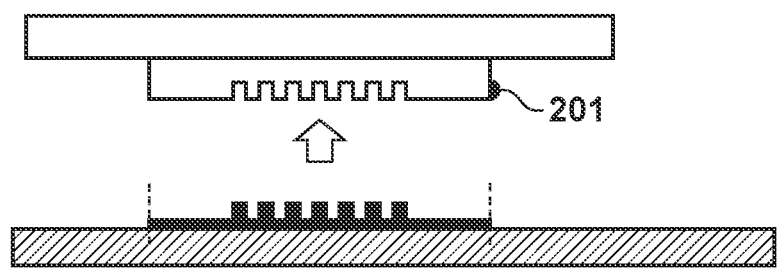

The imprint material 120 is cured by the curing unit 103 in this state, and the imprint material 120 and the mold 101 are separated when the mold holding unit 102 is raised. At this time, an imprint material 201 will remain on the edge portion of the mesa portion 101a (FIG. 2C).

Figure 3A:
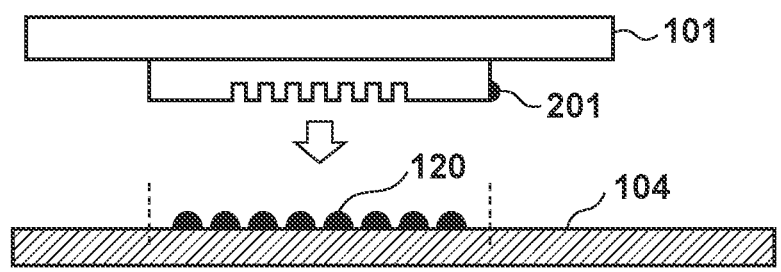
FIGS. 3A to 3C are views for explaining the extrusion of the imprint material that can occur in the imprint process.

The stage 105 is driven, and the dispenser 110 supplies the imprint material 120 to the next shot region on the substrate 104. At this time, as shown in FIG. 3A, the imprint material 201 that adhered to the edge portion of the mesa portion 101a of the mold 101 in the imprint process of the preceding shot region remains.

Figure 3B:
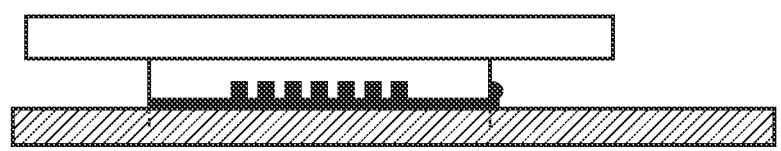

Next, when the mold holding unit 102 is lowered and the mold 101 and the imprint material 120 on the shot region come into contact with each other, the pattern portion of the mold 101 is filled with the imprint material 120. At this time, a portion of the imprint material 120 is extruded from the shot region and the extruded imprint material is drawn to the imprint material 201 remaining on the edge portion of the mesa portion 101a (FIG. 3B).

Figure 3C:
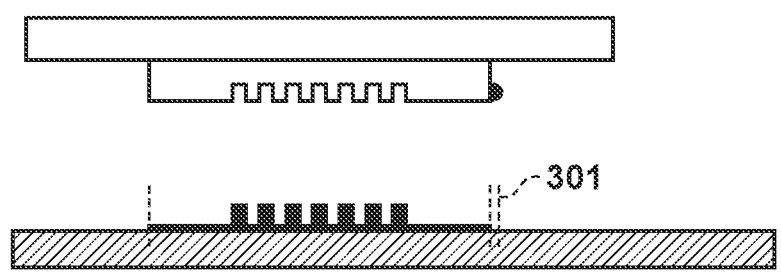

The imprint material 120 is cured by the curing unit 103 in this state, and the imprint material 120 and the mold 101 are separated when the mold holding unit 102 is raised. At this time, an imprint material 301 formed by the integration of the imprint material 201 and the newly extruded imprint material will remain on the edge portion of the mesa portion 101a (FIG. 3C). Note that FIGS. 2A to 2C and FIGS. 3A to 3C are deformed schematic views and do not exemplify the actual shapes and dimensions of the pattern and the extrusion.

The change in the extrusion amount of the imprint material from the shot region is considered to be correlated with the adherence amount of the imprint material to the edge portion of the mesa portion of the mold. Since the extrusion amount will increase as the imprint operation is repeated, the timing to replace or clean the mold can be known by observing the change in the extrusion during the repetitive operation of the imprint operation.

Figure 4:
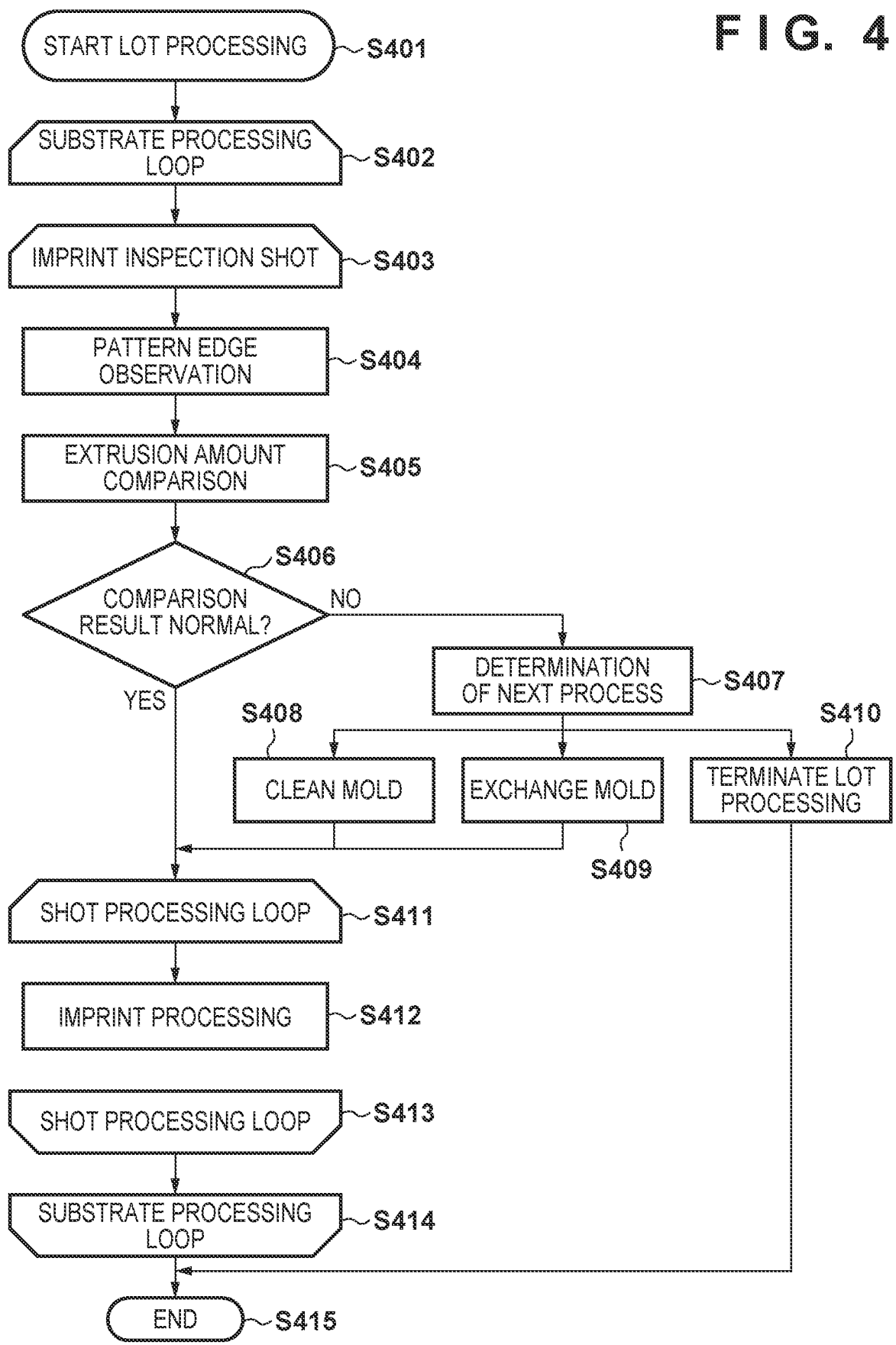
FIG. 4 is a flowchart of imprint control processing according to the embodiment.

FIG. 4 is a flowchart of a control method of a series of imprint processes for one lot by the imprint apparatus 100 according to this embodiment. A lot is a unit of imprint processes performed on a set of a predetermined number of substrates. The control program corresponding to this flowchart is stored in, for example, the memory of the controller 130 or the storage unit 131, and is executed by the CPU of the controller 130. For example, lot processing is started (step S401) in response to an activation instruction from a user. In a substrate processing loop of steps S402 to S414, a series of processes in which a substrate is loaded to a stage, an imprint process is performed on each shot region of the substrate, and the substrate is unloaded from the stage will be executed on each substrate of the lot.

Steps S403 to S407 form an inspection process to determine whether to continue or stop the series of imprint processes while the series of imprint processes is performed on the lot. In step S403, an imprint process is performed on a shot (an inspection shot) for inspection. For example, the inspection shot is selected from a full shot region instead of a peripheral shot region. A "peripheral shot region" is a shot region partially protruding from the periphery of the substrate and to which only a part of the pattern portion of the mold is transferred in the peripheral portion of the substrate. This peripheral shot region is also referred to as a "partial shot region". A "full shot region" refers to a shot region other than the peripheral shot region. Although the inspection shot may be selected from the peripheral shot region, it is preferable to select a plurality of peripheral shot regions so that all of the edge portions of the mesa portion of the mold will be used in this case.

Note that although the inspection process of steps S403 to S407 is performed on every substrate, the present invention is not limited to this. It may be arranged so that the inspection process will be performed on only some of the substrates in accordance with a predetermined schedule. Alternatively, the performance frequency of subsequent inspection processes may be changed in accordance with the result (the extrusion amount of the imprint material or its rate of change to be described later) of the inspection process.

In step S404, the first image capturing unit 141 captures an image of the edge portion (the pattern edge portion) of the pattern, formed on the shot region, to observe the extrusion of the imprint material. In regard to the extrusion amount of the imprint material, a very small amount, for example, 1 μm or less is set as the observation target. However, since a high-resolution camera has a small angle of view, the productivity will degrade if all of the pattern edge portions are observed by the high-resolution camera. Thus, the observation of the extrusion amount in step S404 may be performed by focusing on a representative point such as a corner portion of the pattern.

Next, an extrusion amount comparison process is performed in step S405. The extrusion amount comparison process includes obtaining the extrusion amount of the imprint material from the shot region due to the imprint process by comparing the peripheral portion of the pattern in the image obtained in step S404 and the design value of the position of the peripheral portion. For example, a line (an imprint material filling line) of the edge of the imprint material pattern and a design line of the edge of the shot region are compared. In a case in which the imprint material filling line protrudes outside the design line (that is, outside the shot region), it will be determined to be in an "extrusion" state, and the extrusion amount will be measured. In a case in which the imprint material filling line is within the design line (that is, within the shot region), it will be determined to be in an "unfilled" state. The extrusion state and the unfilled state may be determined by image recognition by machine learning of images of the extrusion state and images of the unfilled state. The extrusion amount obtained by the comparison process is stored as a history in the storage unit 131.

In step S406, in the case in which the same mold is being used continuously, information indicating the change in the extrusion amount over a plurality of imprint processes including the current imprint process performed in step S403 is obtained. For example, an extrusion amount obtained in the current imprint process is compared with an extrusion amount obtained in the past. In a case in which there is no previously obtained extrusion amount data, the comparison result of the extrusion amount obtained in the current imprint process can be determined to be normal. An extrusion amount obtained in the past can be, for example, an extrusion amount obtained in an immediately preceding process. Also, the extrusion amount obtained in the past may be the average value of an extrusion amount obtained in the immediately preceding process and at least one extrusion amount obtained from a process further in the past than the immediately preceding process. Comparing the extrusion amount of the current process with an average amount can alleviate the influence of a sudden abnormal extrusion amount. The change in the extrusion amount can be grasped by comparing the extrusion amount obtained in the current process and the extrusion amount obtained in a past process.

In one example, the information indicating the change in the extrusion amount can include the rate of change in the extrusion amount. In a case in which the rate of change in the extrusion amount has exceeded a predetermined threshold, it will be determined that the extrusion amount is abnormal. It will also be determined that the extrusion amount is abnormal in a case in which the rate of change in the extrusion amount has exceeded a tolerance. In addition, since the imprint process count at which the extrusion amount will reach the tolerance can be predicted from the change in the extrusion amount, it is possible to take, in the shot processing loop of steps S411 to S413, a measure such as stopping the lot processing before the extrusion amount equals or exceeds the tolerance.

Note that the information indicating the change in the extrusion amount is expressed by using a statistic of the extrusion amount. For example, the information indicating the change in the extrusion amount can be information indicating the change in the maximum value of distance between each position of the peripheral portion of the pattern and the design value of each position of the peripheral portion in the obtained image. Alternatively, the information indicating the change in the extrusion amount can be information indicating the change in the area of the pattern protruding from the design line of the peripheral portion of the pattern in the obtained image. In addition, other than the change in the area, it may be a statistic such as the change in the volume (droplet amount), the change in the length of the perimeter of the pattern edge portion, or the like. The change in volume can be obtained by using an area obtained by image analysis and the height information of at least one point that has been obtained by a sensor or the height information of the imprint material when the imprint material is extruded that has been obtained empirically. The change in the perimeter of the pattern edge portion can be obtained by the peripheral portion information of the pattern of the image.

In a case in which it is determined that the extrusion amount is abnormal in step S406, determination of the next process to transition from the current process will be performed in step S407. The next process can be a process selected from a process to clean the mold (step S408), a process to exchange the mold with another mold (step S409), and a process to cancel the lot processing (the series of imprint processes of the lot) (step S410). The process to be selected among the processes of steps S408 to S410 can be determined based on, for example, the extrusion amount, the rate of change in the extrusion amount, an image used in the inspection, or a combination of these pieces of information. Alternatively, it is possible to determine which of the processes of steps S408 to S410 will be the next process to transition from the current process based on a selection instruction from the user (operator). It may also be arranged so that a computer will learn the determination of the operator (the selection instruction by the operator) and make a determination automatically. In addition, the rate of change in the extrusion amount or its change amount may be used as an index for determining the next process. For example, in a case in which the rate of change in the extrusion amount is greater than a threshold, the process to cancel the lot processing in step S410 will be selected. Otherwise, the process of step S408 or step S409 will be selected.

In a case in which it is determined that the extrusion amount is normal in step S406 or in a case in which the molds is cleaned in step S408 or in a case in which the mold is exchanged in step S409, the shot processing loop of steps S411 to S413 is performed. That is, in a case in which the imprint process of every shot region has been completed in step S413 and it is determined that a next substrate is present in step S414, the process returns to step S402 to perform the process repeatedly on the next substrate. The processing ends (S415) when it is determined in step S414 that processing of all of the substrates has been completed.

Figure 5:
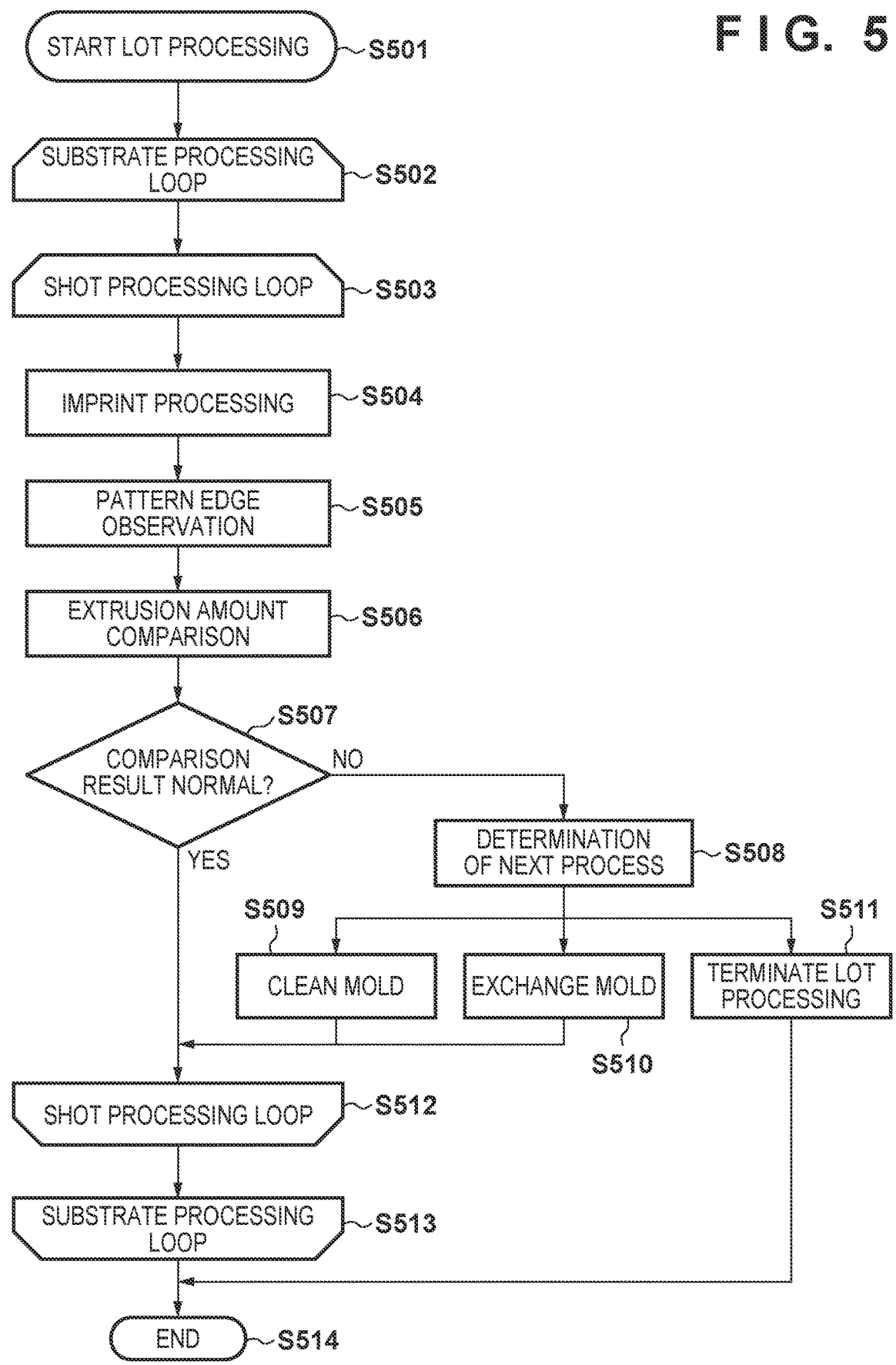
FIG. 5 is a flowchart of the imprint control processing according to the embodiment.

FIG. 5 is a flowchart showing a modification of the imprint control processing (lot processing) shown in FIG. 4. An inspection process (steps S403 to S406) is performed before the shot processing loop is started in the example shown FIG. 4. In contrast, in the example shown FIG. 5, the inspection process is performed during the shot processing loop.

For example, the lot processing is started in response to an activation instruction from a user (step S501). In the substrate processing loop of steps S502 to S513, a series of processes in which a substrate is loaded to a stage, an imprint process is performed on each shot region of the substrate, and the substrate is unloaded from the stage will be executed on each substrate of the lot.

Steps S503 to S512 form a shot processing loop, and an imprint process is performed on each shot region in step S504. Subsequently, the inspection process of steps S505 to S507 is performed. In step S505, the extrusion of the imprint material is observed by capturing an image of the edge portion of the pattern by the first image capturing unit 141, and in step S506, an extrusion amount comparison process is performed. If it is determined in step S507 that the extrusion amount is abnormal, the determination of the next process is performed in step S508. The next process can be a process to clean the mold (step S509), a process to exchange the mold with another mold (step S510), or a process to cancel the lot processing (step S511). The inspection process of steps S505 to S507 described above is the same as the inspection process of steps S404 to S406 of FIG. 4. In addition, the next process determination process of step S508 to S511 is the same as the process performed in step S407 to S410 in FIG. 4.

However, the inspection process of steps S505 to S507 may be performed on every shot or on only some of the shots in accordance with a predetermined schedule. Alternatively, the performance frequency of subsequent inspection processes can be changed in accordance with the extrusion amount or its rate of change. For example, the performance frequency of the inspection process is determined based on the balance with the degradation in productivity that can be tolerated. For example, it may be set so that the extrusion amount will be roughly observed first on a substrate processing basis in accordance with the flowchart of FIG. 4 and the inspection of the extrusion amount can be performed finely on a shot processing basis in accordance with the flowchart of FIG. 5 when the extrusion amount has exceeded the threshold.

As described above, according to this embodiment, an inspection process is performed to obtain information indicating the change in the extrusion amount of the imprint material over a plurality of imprint processes, and the obtained information is used to determine a next process to transition from the current process upon stopping the series of imprint processes. By periodically performing such an inspection process, it becomes possible to suitably determine whether the mold needs to be exchanged, cleaned, or the like. As a result, the maintainability can be improved.

Embodiment of Article Manufacturing Method

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 6, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

Figure 6:
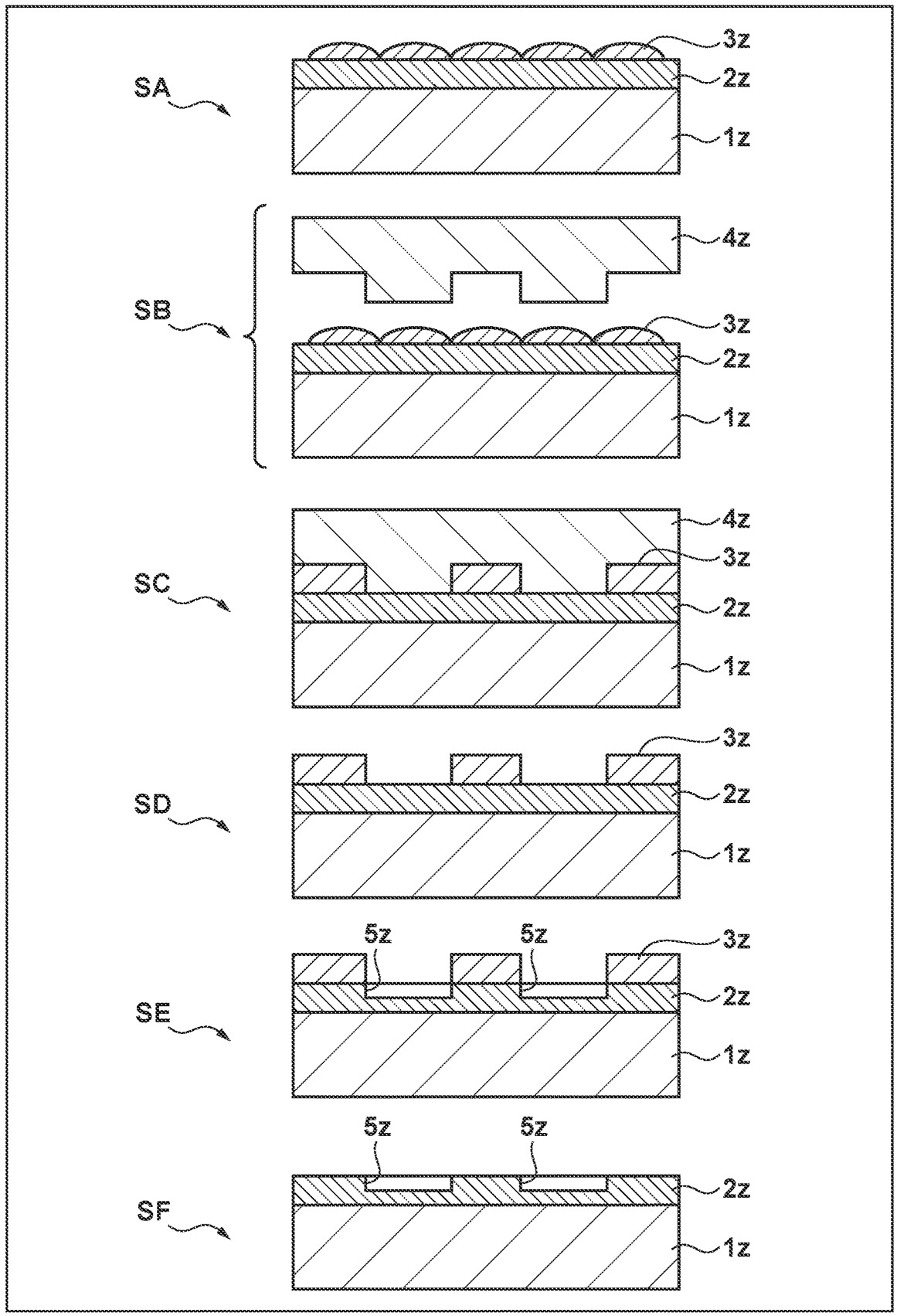
FIG. 6 is a view for explaining a method of manufacturing an article according to the embodiment.

As shown in step SB of FIG. 6, a side of an imprinting mold 4z on which its three-dimensional pattern is formed faces the imprint material 3z on the substrate. In step SC of FIG. 6, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 6, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 6, when the pattern of the cured material is etched as an etching resistant mask, portions out of the surface of the processing target material 2z where the cured material is not present or thinly remains are removed, and grooves 5z are achieved. In step SF of FIG. 6, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-043044, filed Mar. 8, 2019, which is hereby incorporated by reference herein in its entirety.

What is claimed is:

1. A method of controlling an imprint apparatus that performs an imprint process to form a pattern on an imprint material by using a mold on a shot region of a substrate, the method comprising:
   inspecting to determine whether to continue or stop a series of imprint processes during the series of imprint processes in a lot including a plurality of substrates,
   wherein the inspecting includes:
      capturing an image of the pattern formed on the shot region by the imprint process,
      obtaining, by comparing a position of a peripheral portion of the pattern in the image obtained in the capturing and a design value of the position of the peripheral portion, an extrusion amount of the imprint material from the shot region due to the imprint process, and
      determining, based on information indicating a change in the extrusion amount over a plurality of imprint processes, an imprint process count indicating a number of imprint processes to be continuously performed in the lot and a next process to transition from a current process upon stopping the series of imprint processes in the lot, wherein determining includes predicting the imprint process count at which the extrusion amount will reach over a tolerance, based on the information indicating the change in the extrusion amount over the plurality of imprint processes.

2. The method according to claim 1, wherein the information includes a rate of change in the extrusion amount.

3. The method according to claim 2, wherein in a case in which the rate of change in the extrusion amount is greater than a threshold, a process to cancel the series of imprint processes of the lot is selected as the next process.

4. The method according to claim 1, wherein the information is information indicating a change in a maximum value of a distance between each position of the peripheral portion of the pattern in the image and a design value of each position of the peripheral portion of the pattern.

5. The method according to claim 1, wherein the information is information indicating a change in an area of a pattern protruding from a design line of the peripheral portion of the pattern in the image.

6. The method according to claim 1, further comprising:
   determining whether the extrusion amount is normal or abnormal based on the information,
   wherein in a case in which the extrusion amount is determined to be abnormal in the determining, the next process is a process selected from a process to clean the mold, a process to exchange the mold with another mold, and a process to cancel the series of imprint processes of the lot.

7. The method according to claim 6, wherein the selection of the next process from the process to clean the mold, the process to exchange the mold with the other mold, and the process to cancel the series of imprint processes of the lot is made based on the extrusion amount, the rate of change in the extrusion amount, the image, or a combination of the extrusion amount, the rate of change in the extrusion amount, and the image.

8. The method according to claim 6, wherein the selection of the next process from the process to clean the mold, the process to exchange the mold with the other mold, and the process to cancel the series of imprint processes of the lot is made in accordance with a selection instruction by a user.

9. The method according to claim 1, wherein the inspecting is performed on all of the substrates of the lot.

10. The method according to claim 1, wherein the inspecting is performed on only some of the plurality of substrates of the lot.

11. The method according to claim 1, wherein the inspecting is performed on only some shot regions of a plurality of shot regions of the substrate.

12. The method according to claim 1, wherein the determining comprises:
   determining, based on the predicted imprint process count, the next process to transition from the current process upon stopping the series of imprint processes.

* * * * *